(12) United States Patent
Frater

(10) Patent No.: US 6,355,360 B1
(45) Date of Patent: Mar. 12, 2002

(54) SEPARATOR SHEET LAMINATE FOR USE IN THE MANUFACTURE OF PRINTED CIRCUIT BOARDS

(75) Inventor: Mark S. Frater, Stockton, CA (US)

(73) Assignee: R.E. Service Company, Inc., Lodi, CA (US)

( * ) Notice: Subject to any disclaimer, the term of this patent is extended or adjusted under 35 U.S.C. 154(b) by 0 days.

(21) Appl. No.: 09/684,166

(22) Filed: Oct. 5, 2000

Related U.S. Application Data

(63) Continuation-in-part of application No. 09/620,109, filed on Jul. 20, 2000, now Pat. No. 6,235,404, which is a continuation of application No. 09/193,461, filed on Nov. 17, 1998, now Pat. No. 6,129,990, which is a continuation-in-part of application No. 09/182,956, filed on Oct. 29, 1998, now Pat. No. 6,127,051, and a continuation-in-part of application No. 09/058,262, filed on Apr. 10, 1998, now Pat. No. 6,129,998, said application No. 09/193,461, filed on Nov. 17, 1998, now Pat. No. 6,129,990.

(51) Int. Cl.⁷ ................................................. B32B 15/00
(52) U.S. Cl. ........................ 428/607; 428/606; 428/612; 428/626; 428/652; 428/677; 428/687; 428/198; 428/201; 428/926
(58) Field of Search ................................. 428/607, 606, 428/612, 677, 687, 652, 626, 198, 201, 926

(56) References Cited

U.S. PATENT DOCUMENTS

| | | |
|---|---|---|
| 2,688,348 A | 9/1954 | Sullivan |
| 2,706,165 A | 4/1955 | Korsgaard |
| 2,774,698 A | 12/1956 | Jenk et al. |
| 3,589,975 A | 6/1971 | Andrews et al. |
| 3,592,722 A | 7/1971 | Morgan |
| 3,647,592 A | 3/1972 | Woodberry |
| 3,730,825 A | 5/1973 | Nakane |
| 3,808,088 A | 4/1974 | Knechtges et al. |
| 3,932,250 A | 1/1976 | Sato et al. |
| 3,936,548 A | 2/1976 | Konicek |
| 3,948,701 A | 4/1976 | Fasbender et al. |
| 3,984,598 A | 10/1976 | Sarazin et al. |
| 3,990,926 A | 11/1976 | Konicek |
| 4,022,648 A | 5/1977 | Woodberry et al. |
| 4,023,998 A | 5/1977 | Cederberg et al. |

(List continued on next page.)

FOREIGN PATENT DOCUMENTS

| | | |
|---|---|---|
| DE | 28 43 263 | 2/1980 |
| DE | 31 31 688 | 5/1982 |
| DE | 41 16 543 A | 11/1992 |
| DE | 297 19 716 U | 12/1997 |
| EP | 0 212 124 | 3/1987 |
| EP | 0 235 582 | 9/1987 |
| EP | 299 454 | 1/1989 |
| EP | 0 411 142 A | 2/1991 |
| EP | 0 872 301 A | 10/1998 |
| GB | 1 217 104 A | 12/1970 |
| JP | 52-5353 | 2/1977 |
| JP | 62-208915 | 9/1987 |
| JP | 2-58885 | 2/1990 |
| JP | 2-291191 | 11/1990 |
| JP | 2-310041 | 12/1990 |
| JP | 4-186798 | 7/1992 |

OTHER PUBLICATIONS

Pohl et al., "Producing and Jointly Processing Base Laminates for Multilayer Printed Circuit Cards," IBM Technical Disclosure Bulletin, vol. 27, No. 8, Jan. 1985, pp 4841–4842.

Declaration of Robert Jordan, United States District Court, Northern District of California, San Jose Division, Case No. C92–20672 JW (PVT), Nov. 25, 1992.

Primary Examiner—Robert R. Koehler
(74) Attorney, Agent, or Firm—John P. O'Banion

(57) ABSTRACT

A sheet laminate for use in a press lay-up between printed circuit board panels having a steel substrate layer and a copper foil layer releasably bonded with resistance welds and adhesive to at least one surface of the substrate layer.

33 Claims, 1 Drawing Sheet

U.S. PATENT DOCUMENTS

| | | |
|---|---|---|
| 4,092,925 A | 6/1978 | Fromson |
| 4,113,576 A | 9/1978 | Hutkin |
| RE29,820 E | 10/1978 | Konicek |
| 4,179,324 A | 12/1979 | Kirkpatrick |
| 4,180,608 A | 12/1979 | Del |
| 4,351,873 A | 9/1982 | Davis |
| 4,357,395 A | 11/1982 | Lifshin et al. |
| 4,381,327 A | 4/1983 | Briere |
| 4,383,003 A | 5/1983 | Lifshin et al. |
| 4,394,419 A | 7/1983 | Konicek |
| 4,446,188 A | 5/1984 | Patel et al. |
| 4,455,181 A | 6/1984 | Lifshin et al. |
| 4,568,413 A | 2/1986 | Toth et al. |
| 4,587,152 A | 5/1986 | Gleichenhagen et al. |
| 4,715,116 A | 12/1987 | Thorpe et al. |
| 4,722,765 A | 2/1988 | Ambros et al. |
| 4,775,599 A | 10/1988 | Matsuoka et al. |
| 4,781,969 A | 11/1988 | Kobayashi et al. |
| 4,788,102 A | 11/1988 | Koning et al. |
| 4,847,146 A | 7/1989 | Yeh et al. |
| 4,853,273 A | 8/1989 | Harris, Jr. |
| 4,872,934 A | 10/1989 | Kameda |
| 4,875,283 A | 10/1989 | Johnston |
| 4,961,806 A | 10/1990 | Gerrie et al. |
| 5,030,302 A | 7/1991 | Jud et al. |
| 5,057,372 A | 10/1991 | Imfeld et al. |
| 5,096,522 A | 3/1992 | Kawachi et al. |
| 5,120,590 A | 6/1992 | Savage et al. |
| 5,153,050 A | 10/1992 | Johnston |
| 5,350,621 A | 9/1994 | Yuhas et al. |
| 5,407,744 A | 4/1995 | Herrero et al. |
| 5,512,381 A | 4/1996 | Konicek et al. |
| 5,674,596 A | 10/1997 | Johnston |
| 5,716,168 A | 2/1998 | Janoff |
| 5,725,937 A | 3/1998 | Johnston |
| 5,789,066 A | 8/1998 | De Mare et al. |
| 5,951,803 A | 9/1999 | Johnston |
| 5,997,983 A | 12/1999 | Caron et al. |
| 6,127,051 A | 10/2000 | Frater .................... 428/677 |
| 6,129,990 A | 10/2000 | Frater .................... 428/607 |
| 6,129,998 A | 10/2000 | Frater .................... 428/677 |
| 6,130,000 A | 10/2000 | Frater .................... 428/687 |
| 6,235,404 B1 * | 5/2001 | Frater .................... 428/607 |

OTHER PUBLICATIONS

Declaration of Glynn Shaw, United States District Court, Northern District of California, San Jose Division, Case No. C92 20672 JW (PVT), Nov. 30, 1992.

Declaration of Alan Gishi, United States District Court, Northern District of California, San Jose Division, Case No. C92 20672 JW (PVT), Dec. 7, 1992.

Memorandum to the Assistant Commissioner of Patents, Response to Petition for Public Use Proceeding Under Proceeding Under 37 CFR 1.292, Ser. No. 07/955,121, United States Patent and Trademark Office, Dec. 8, 1994, pp. 3–4.

Examiner's Action, Ser. No. 07/955,121, United States Patent and Trademark Office, Jul. 11, 1996, pp. 7–8.

Hinton, P., "The High–Yield Challenge in Laminating MLBs," Electronic Packaging and Production, vol. 30, No. 1, pp. 56–61, Jan. 1990.

* cited by examiner

SEPARATOR SHEET LAMINATE FOR USE IN THE MANUFACTURE OF PRINTED CIRCUIT BOARDS

CROSS-REFERENCE TO RELATED APPLICATIONS

This application is a continuation-in-part of application Ser. No. 09/620,109 filed on Jul. 20, 2000, now U.S. Pat. No. 6,235,404, which is a continuation of application Ser. No. 09/193,461 filed on Nov. 17, 1998, now U.S. Pat. No. 6,129,990, which in turn is a continuation-in-part of application Ser. No. 09/182,956 filed on Oct. 29, 1998, now U.S. Pat. No. 6,127,051, and a continuation-in-part of application Ser. No. 09/058,262 filed on Apr. 10, 1998, now U.S. Pat. No. 6,129,998.

This application is also a continuation-in-part of application Ser. No. 09/193,461 filed on November 17, 1998, now U.S. Pat. No. 6,129,990, which in turn is a continuation-in-part of application Ser. No. 09/182,956 filed on Oct. 29, 1998, now U.S. Pat. No. 6,127,051, and a continuation-in-part of application Ser. No. 09/058,262 filed on Apr. 10, 1998, now U.S. Pat. No. 6,129,998.

This application is also a continuation-in-part of application Ser. No. 09/182,956 filed on Oct. 29, 1998, now U.S. Pat. No. 6,127,051, which is a continuation-in-part of application Ser. No. 09/058,262 filed on Apr. 10, 1998, now U.S. Pat. No. 6,129,998.

This application is also a continuation-in-part of application Ser. No. 09/058,262 filed on Apr. 10, 1998, now U.S. Pat. No. 6,129,998.

Priority is claimed to each of the foregoing patent applications.

STATMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention pertains generally to the fabrication of multi-layered printed circuit boards, and more particularly to method for attaching copper and steel sheets for use in the manufacture of printed circuit boards, as well as to laminated copper/steel sheets fabricated according to the attachment method.

2. Description of the Background Art

Printed circuit board (PCB) lay-up panels are widely used in the electronics industry, and a number of approaches have been taken to laminate PCB lay-up panels. In early stages of development, PCB lay-up panels were laminated using presses similar to those used in the wood industry for laminating, for example, sheets of plywood. During manufacture, steam or electric power was used to heat hydraulic-driven presses to temperatures exceeding 350° F. The panel components in the presses were submitted to pressures between 300 psi and 500 psi at 350° F. for approximately one hour to achieve proper lamination. With the early methods, highly polished and precision ground stainless steel plates approximately 0.062 inches thick were used to separate each panel within a press opening. Typically, a T-304 full hard alloy or equivalent material was used for these 0.062 stainless steel separator plates. A regular problem, however, was that these stainless steel 0.062 separator plates required cleaning or scrubbing to remove debris after every use and periodically needed to be resurfaced to remove dents and scratches due to handling and use. Eventually, the plates had to be replaced.

During the late 1980's, the introduction of vacuum assisted presses permitted the use of lower pressures during the lamination cycle. The pressures used in vacuum assisted presses typically ranged from approximately 150 psi to 250 psi, as opposed to the 300 psi to 500 psi range used in the hydraulic steam driven or electric presses. With vacuum assisted presses, aluminum separator sheets ranging in thickness from 0.007 to 0.015 inches were tested and then used extensively. Test results published during that time indicated that thin aluminum separator plates far exceeded the performance of steel plates for laminating PCB panels. These thin aluminum separator sheets were discarded after the lamination process, thus eliminating the need for expensive steel plate cleaning and handling operations and the frequent and large capital investment needed to replace the steel plates.

The alloy used for aluminum separator plates is typically 3000 series (e.g. 3003, 3004, 3105 or equivalent) with a H19 hardness designation, which is identical to the alloy used to make aluminum beverage cans. The process using thin aluminum separator sheets along with low pressure from vacuum assisted presses has worked well for typical 4 layer to 6 layer PCB's with circuit lines of approximately 0.008 inches in width and approximately 0.008 inches apart. A typical configuration in a press opening would be a steel plate on top and bottom of the stack with thin aluminum sheets separating each PCB panel. The rate of production in these vacuum assisted presses increased to about 10–14 PCB panels per typical 1½ inch press opening from the 6 to 8 PCB panels achieved using 0.062 stainless steel sheets.

Technological advancements, however, have driven a need for PCBs to have denser circuitry. This means that circuits must have finer lines (less than 0.006 inches wide) and closer spacing between circuit lines (less than 0.006 inches). Denser surfaces on a PCB permit a higher quantity of electrical components to be mounted thereon, thus enabling faster information processing and greater miniaturization of electronic hardware. These greater technological demands have made the surface quality of the laminated circuit board panels even more critical. Problems such as surface roughness and image transfer that also previously existed, have now become critical issues that require resolution, since any minute bump on the surface of the aluminum sheet will be transferred to the top surface of the board necessitating scraping the board and reworking the PCB fabrication process.

To prevent and minimize scrap and rework due to image transfer and surface quality problems, almost every press configuration used today employs 0.062 stainless steel plates (usually T-304 or T-600 stainless steel) placed adjacent to the thin aluminum separator sheets in addition to on the top and bottom of the stack. Many press loads have at least three steel plates added to the lay-up, which then reduces the number of panels that can be laminated in each press cycle. Some of the lay-up configurations have both aluminum sheets and steel plates separating every panel in the press, with the aluminum separator sheets being discarded after the press cycle. This approach, however, has not completely cured the problem as it causes a decrease in the production rate of the press. Also, pits, dents and other surface imperfections due to the re-introduction of steel plates into the process are still causing scrap and rework of PCB panels. Moreover, many PCB fabricators have to purchase additional new 0.062 stainless steel plates and again install expensive plate cleaning and handling systems. Although the thin aluminum separator sheets are discarded after every press cycle, the steel plates must be cleaned before each use, adding additional operational steps and cost to the PCB fabrication process. To maintain production demands, fabricators must purchase additional vacuum presses, at a cost of approximately $250,000 to $1,000,000 per unit, to compensate for the loss of productivity due to the re-introduction of steel plates into the PCB fabrication process.

Today, fabricators are typically producing between 3 and 8 PCB panels on high technology "dense" boards and encounter more quality problems and higher costs. State of the art dense PCB's now require 2 separators including a 0.062 stainless steel plate and a thin sheet of aluminum. This is an expensive step backward to the beginning of the evolution of the PCB fabrication process.

Use of a thin piece of aluminum in a copper/aluminum laminate structure simply does not meet today's demanding requirements for high technology, dense PCB's. Such laminates suffer from a number of drawbacks that include the susceptibility to print through and image transfer, misregistration, blistering, warpage and delamination. In addition, these laminates exhibit unacceptable surface roughness.

Off contact printing often results from image transfer. This generally inhibits the adhesion of dry film and the ability to expose a one to one image on panels. As a result, such laminates are typically limited to the fabrication of four to six layer PCB's. In addition, shims are often required between every PCB panel. The use of shims adds significant cost to PCB manufacture. The shims must go through a labor intensive cleaning process between each use. Shims are very expensive and many PCB manufacturers have had to set aside space in their manufacturing facilities for shim cleaning.

Misregistration results from too much movement in the inner layers. This causes drill breakage and renders the PCB useless. Drill breakage also results from misregistration in high technology PCBs where small holes which are less 13 mils and as small as 4 mils are typical.

Blistering results from the uneven coefficient of thermal expansion exhibited by aluminum. The uneven CTE creates more hot spots that cause blistering. This problem may not become apparent for six months or more after fabrication and, therefore, may cause major system failures.

Surface roughness is also a problem with aluminum. The high surface roughness will cause off contact printing, broken drill bits, and loss of materials. The laminates are also susceptible to warpage, which renders them useless. And, delamination has been observed using the laminates at low pressures.

Accordingly, there is a need for a copper/metal laminate for use in manufacturing printed circuit boards that exhibits reduced incidence of misregistration, warpage, blistering, image transfer and other undesirable characteristics. The present invention addresses that need, as well as others, and overcomes deficiencies found in conventional copper/metal laminates used for manufacturing printed circuit boards.

BRIEF SUMMARY OF THE INVENTION

The deficiencies inherent in conventional PCB laminates and lamination processes are overcome by the laminate structure of the present invention which generally comprises a sheet of metal, preferably other than aluminum or copper, that is attached to a sheet of copper. The present invention is an extension of the laminated sheet structure and method of attaching the sheets described in my prior U.S. Pat. Nos. 6,129,990 and 6,127,051 which are incorporated herein by reference.

By way of example, and not of limitation, the present invention preferably comprises a steel alloy layer having a corrosive resistant coating and a copper foil layer that is attached to the steel alloy layer. Attachment of the cooper and steel is preferably by means of a combination of adhesive and resistance welds. The adhesive is preferably positioned in strips or lines on one set of opposing sides of the board and the resistance welds are preferably positioned on a second set of opposing sides. In this way, a series of spaced apart resistance welds joins the materials along at least a first perimeter edge, and the adhesive joins the materials along at least a second perimeter edge that is adjacent to the first.

The adhesive portion of the attachment can be facilitated in any conventional manner using, for example, adhesive materials described in used in U.S. Pat. No. 5,153,050 incorporated herein by reference, U.S. Pat. No. 5,120,590 incorporated herein by reference, or U.S. Pat. No. 5,512,381 incorporated herein by reference. Further, it does not matter whether the adhesive is flexible or rigid. It will be appreciated, however, that the adhesive should be of a type that either releases the metal layers at press temperatures or otherwise does not interfere with the subsequent separation of the metal layers.

The resistance welding portion of the attachment can be facilitated by making contact bonds between the surfaces of the metal materials, generally in the form of circular-shaped welds of approximately 4-mils to 20-mils in diameter. Passing an electrical current through the metal layers to be joined generates each weld.

In the present invention, the copper foil layer is attached to either one or both sides of the steel layer. When heated and compressed onto the PCB panel, the copper adheres to and becomes a functional element of the final PCB. The steel layer is subsequently removed and discarded. Use of the steel layer of the present invention eliminates and/or reduces the need for conventional 0.062 stainless steel plates in the press lay-up. As a result, the surface quality of the PCB is improved, image transfer is reduced and a flatter, less wavy PCB is produced without the cost of using separate 0.062 stainless steel separator plates. Furthermore, the similarity in the coefficients of thermal expansion (CTE) between steel in accordance with the present invention and copper allows the PCB's produced to be flatter, thus providing for a better registration of the foil layer to the substrate layer of the sheet laminate.

Additional information regarding sheet laminate fabrication technology and processes for manufacturing PCB's can be found in U.S. Pat. Nos. 4,875,283, 5,120,590, 5,512,381 and 5,153,050, each of which is incorporated herein by reference.

The copper/steel laminate structure of the present invention also exhibits superior performance over copper/aluminum, copper/copper, and other known copper/metal laminate structures. For example, with the laminate structure of the present invention it is possible to manufacture PCBs having up to eighteen layers without the need to use shims.

Because the steel sheet used in the present invention does not exhibit the image transfer problems associated with aluminum/copper and copper/copper laminates, the invention also allows more PCBs per book as compared to conventional laminates thereby facilitating increased production. In addition, the steel layer allows PCBs to be run at higher pressures, thereby providing a flatter and more usable PCB area. Furthermore, the need for conventional 0.062 stainless steel separator plates is eliminated, with a resulting reducing in material and facility cost.

The steel layer used in the present invention exhibits a more stable heat rise than aluminum, thereby reducing the possibility of misregistration and drill breakage. The similarity in the coefficients of thermal expansion (CTE) between steel and copper allows the PCB's produced to be flatter, thus providing a better registration of the foil layer to the substrate layer of the sheet laminate.

Blistering and warpage are also reduced because the CTE of the metal substrate of the present invention is similar to that of copper. And, the smooth surface of the steel of the present invention promotes the fabrication of high density PCBs. Furthermore, the delamination problems associated with aluminum/copper and copper/copper laminate structures are eliminated.

An object of the invention is to provide a sheet laminate, for use in a press lay-up between PCB layers that eliminates the need for aluminum separator sheets and their associated problems.

Another object of the invention is to reduce the amount of waste in PCB manufacturing.

Another object of the invention is to eliminate the surface quality and image transfer problems associated with aluminum separator sheets.

Another object of the invention is to eliminate the need for constant scrubbing and cleaning of conventional 0.062 stainless steel separator plates.

Another object of the invention is to provide a sheet laminate, for use in a press lay-up between PCB layers that eliminates the need for conventional 0.062 stainless steel plates and their associated problems.

Another object of the invention is to provide a sheet laminate, for use in a press lay-up between PCB layers that reduces and/or eliminates image transfer from the substrate layer onto the foil layer.

Another object of the invention is to provide a sheet laminate, for use in a press lay-up between PCB layers, that results in flatter, less wavy PCB panels.

Another object of the invention is to provide a sheet laminate for use in a press lay-up between PCB layers that has a CTE less than or equal to the CTE of copper.

Still another object of the invention is to provide a sheet laminate, for use in a press lay-up between PCB layers, that maximizes the number of PCB panels that can be produced for a given press opening.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings that are for illustrative purposes only.

DETAILED DESCRIPTION OF THE INVENTION

Referring more specifically to the drawings, where like reference numbers denote like parts, as well as the following technical description, The present invention comprises a laminate sheet structure comprising a thin sheet of steel material bonded to a thin sheet of copper. It will be appreciated that the apparatus may vary as to configuration and as to details of the parts, and that the method may vary as to the specific steps and sequence, without departing from the basic concepts as disclosed herein.

Figure 1:
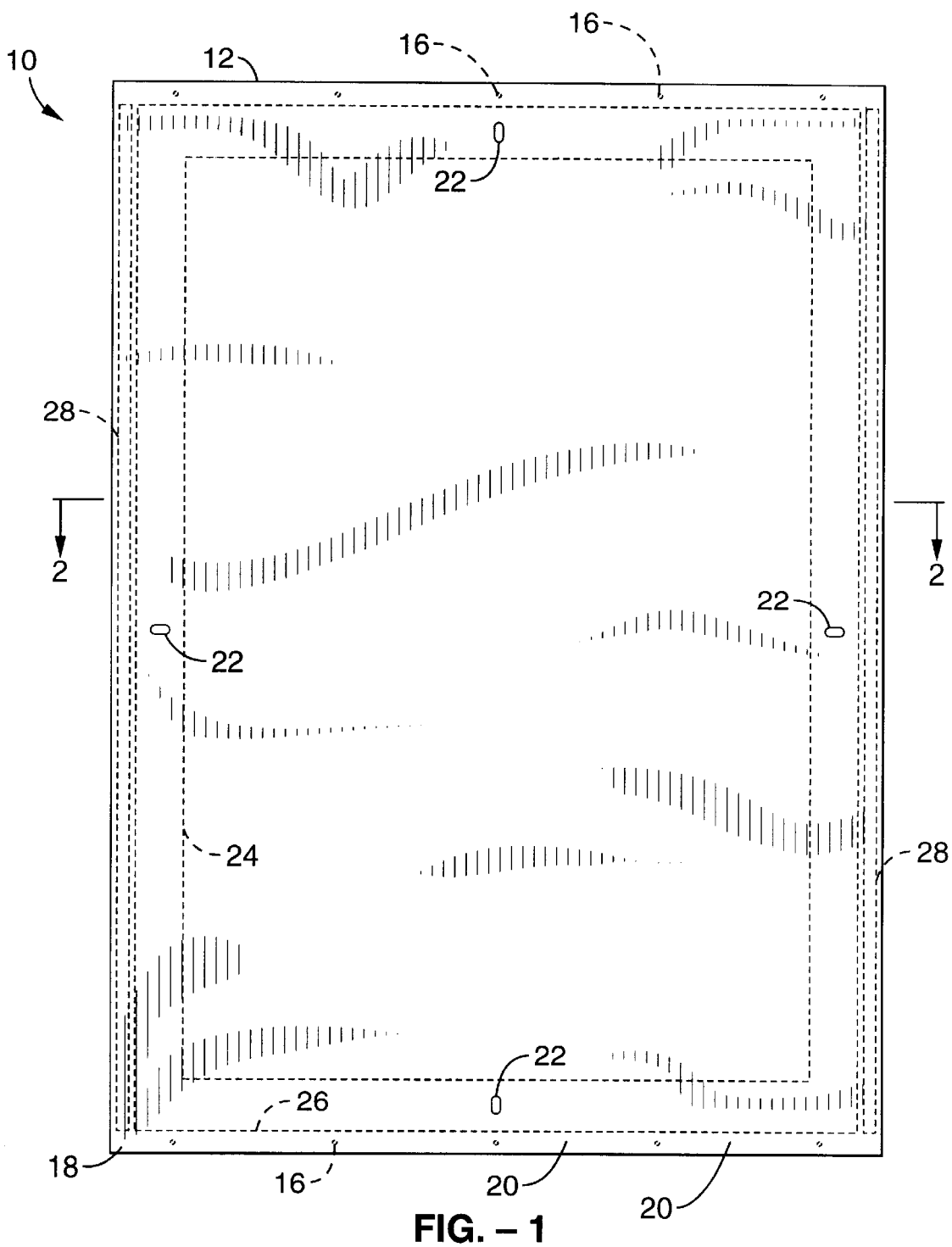
FIG. 1 is a schematic plan view of a laminate sheet in accordance with the present invention.
Figure 2:
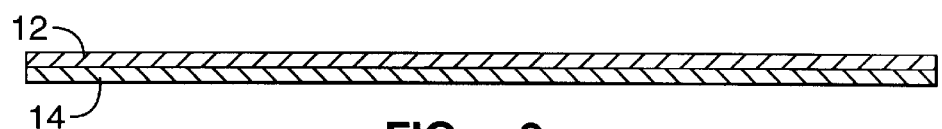
FIG. 2 is a cross-section of the laminate sheet shown in FIG. 1 taken through the line 2—2.

Referring to FIG. 1 and FIG. 2, a sheet laminate 10 for PCB manufacturing in accordance with the preferred embodiment of the present invention is generally shown. Sheet laminate 10 comprises a metal substrate layer 12 bonded to a copper foil layer 14. In accordance with the invention, metal substrate layer 12 preferably comprises a steel alloy having the properties described herein. And, while the invention is described herein in terms of a copper/metal laminate, it will be appreciated that the inventive concepts apply equally to laminates having additional layers, such as copper/metal substrate/copper laminates typically used in the PCB manufacturing industry.

Copper foil layer 14 can be present on either or both sides of steel layer 12. Use of a steel layer in accordance with the present invention has been found to be superior to the commonly used 0.010 inch to 0.015 inch 3004 aluminum substrate for reducing image transfer and improving surface quality of the PCB, while also significantly improving productivity of PCB panels. Sheet laminate 10 of the present invention is designed for use in both traditional low pressure vacuum presses that operate in the range between approximately 150 psi and 250 psi, as well as high pressure presses up to 500 psi, which is well beyond the capability of aluminum.

Nickel or zinc-nickel plated 1008 low carbon steel has been determined to be ideal for meeting the objectives of the invention, although 1001 low carbon steel should also be suitable. The thickness of steel layer 12 can range from approximately 0.002 inches and approximately 0.025 inches, although the preferable thickness range is between approximately 0.005 inches and approximately 0.015 inches. Copper foil layer 14 preferably has a thickness ranging from approximately 0.00025 inches to approximately 0.005 inches.

Greater productivity is accomplished, while still meeting the other objectives of the invention, through use of a steel layer 12 that is approximately 0.008 inches thick and this thickness represents the preferred embodiment of the invention. The use of a steel layer approximately 0.008 inches thick eliminates the need or reduces the number of steel plates required in a press lay-up, resulting in a greater number of PCB panels capable of being placed into the press for a given lamination process. The "kiss cycle" during the lamination process, which is a prerequisite for the successful use of aluminum substrates, can also be eliminated as a result of the use of a steel layer in accordance with the invention, thereby reducing the overall production time. The function of the "kiss cycle" is to soften or melt the epoxy before full pressure is applied. Fully liquefied epoxy flows away from the high-pressure area into regions between circuits to minimize print through.

For illustrative purposes, the metallurgical and other characteristics of the carbon steel alloy used in the present invention are compared with aluminum in Table 1.

It will be appreciated that the surface of the PCB laminate that is produced is only as smooth as the material that is pressed against it. The surface quality of the PCB laminated with metal substrates is improved significantly by employing a steel layer having a surface finish of no greater than approximately 12 RMS. In comparison, aluminum has a surface finish around 18 RMS to 25 RMS. The issue of surface finish is critical especially when miniaturization is an objective, because the fewer imperfections that exist on the surface of the PCB when dense electrical paths are etched thereon, the more reliable the final PCB product. Steel layer 12 employed in the present invention has a low propensity to scratch, pit or dent because it is many times harder than other metals, such as aluminum. Therefore, a PCB laminated with a steel substrate according to the invention will have less likelihood of surface imperfections.

Another the advantage provided by the steel substrate used in sheet laminate 10 is the additional hardness steel offers, along with greater rigidity, which significantly reduces image transfer onto foil layer 14 and ultimately, onto the finished PCB. For purposes of the present invention, a Knoop hardness of approximately 200 for the carbon steel of the invention provides satisfactory results at the desired. A PCB laminated with such a steel substrate is also less wavy as compared to a PCB laminated with an aluminum substrate. It will be appreciated that harder steel substrates are also satisfactory and contemplated within the scope of the present invention. For example, at the specified thicknesses, it is possible to obtain steel substrates from suppliers with Knoop hardness ratings as high as approximately 850. Typically, though, the thin sheets of harder steels are not readily available in the industry. It will further be appreciated that softer steel substrates are also acceptable provided that it is not too soft. For example, a steel alloy substrate having a Knoop hardness of approximately 150 should also provide satisfactory results. It will also be appreciated, that the steel substrate of the present invention should be harder than either aluminum or copper to achieve the desired results described herein.

Preferably the steel substrate is plated with nickel or nickel-zinc to provide corrosion resistance, although other common resistant coats, including polymers or electrolyzed aluminum (chrome), could be used. Lead, however, would not be an appropriate material since it is very soft and will bond to the copper foil layer during the lamination process when heated. An additional surprising characteristic is observed with a nickel-plated steel layer 12; namely, the hardness increases as the substrate is exposed to increasing temperatures. For example, the hardness of the nickel-plated steel increases by approximately 20% as the substrate is heated to the curing temperature of 350° F. The optimum thickness of the nickel plating is typically between approximately $20\mu$ inches and approximately $50\mu$ inches.

The greater rigidity provided by the steel layer 12 used in the present invention also provides better support for copper foil layer 14 and practically eliminates the bellows-effect associated with aluminum substrates. Because of low rigidity, an aluminum substrate flexes easily and, when flexed, the aluminum substrate momentarily separates from the copper foil layer thereby creating a suction that draws dust and debris into the resultant gaps; that is, a bellows effect occurs. As a result of dust and debris entering the gaps, dent and epoxy spots appear on the finished PCB surface. A complete seal between the steel layer 12 and foil layer 14, which is essential for aluminum substrates, is therefore unnecessary for steel substrates.

Significantly, the atomic crystal lattice patterns for conventional aluminum and for the nickel-plated steel of the present invention are very different. The atoms in aluminum are arranged in a face centered cubic (FCC) pattern. The atoms in the steel, however, are arranged in a body centered cubic (BCC) pattern. The nickel-plating on the steel substrate layer is amorphous with no definite microstructure. This material is not a wrought product and is created by an electrical plating process. These crystal lattice patterns significantly influence the physical and mechanical properties of each material and explain why they present different characteristics in the same heated environment.

The heat transfer characteristics of the steel employed in the present invention provide a consistent and uniform heat rise with little variability. It is this uniformity in heat rise that reduces PCB panel thickness variations and provides a more consistent lamination quality with the present invention. The steel should have a CTE less than that of copper (e.g. less than approximately $9.8\mu$ inches/°F.) so as to allow the copper foil layer to proportionally register with the steel substrate layer. During the thermal expansion process, copper foil layer 14 moves more than steel layer 12, so a substrate material having a CTE equal to or less than copper would optimize registration between the two substances.

Steel layer 12 preferably has a coefficient of thermal expansion ranging between approximately $6.5\mu$ inches/°F. and approximately $7.5\mu$ inches/°F. Copper expands to approximately 50% as compared to expansion of aluminum while steel expands to approximately 90% as compared to aluminum. In direct comparison, the CTE of aluminum is 84% greater than that of steel. This means that a 24-inch wide unrestrained sheet of aluminum heated from room temperature (70° F.) to curing temperature will have its width increased by approximately 0.090 inches. A steel sheet of identical proportion will have a width increase of approximately 0.049 inches and copper will have a width increase of approximately 0.066 inches. It can be clearly seen that not only are the dimensional differences between copper and steel less than the dimensional difference between aluminum and copper, the steel expands overall less than the copper which has been determined to be preferable. As a result, the PCB's produced using steel substrates are flatter and more uniform as compared with those produced using aluminum substrates.

The primary material for PCB panels is woven fiberglass that is pre-pregnated (pre-preg) with a viscous thermosetting resin. Copper from the foil layer in the sheet laminate is transferred onto each face of the pre-preg in the press during lamination. During lamination, the woven fiberglass and resin pre-preg are heated and become a viscous liquid, free to expand along with the metals in the stack. Therefore, no significant stresses are induced into these composite materials by thermal expansion during heat up for curing. Since copper foil layer 14 is very thin compared to steel layer 12, frictional forces will restrain the movement of copper foil layer 14 during heating. The copper foil will therefore yield as the substrate material expands. If the substrate material is aluminum, the copper foil layer 14 will be stretched 0.024 inches over the width of a twenty-four inch circuit board heated to the curing temperature, and uneven localized loading will cause the foil layer to be stretched non-uniformly, more in some areas than others, resulting in a "rippling" or "wavy" effect in the copper foil layer.

On the other hand, if the substrate material is steel according to the invention herein, copper foil layer 14 will not be stretched during heating to the curing temperature, and thus no uneven loading will occur on copper foil layer 14 and also blister causing strains in copper foil layer 14 is reduced.

Referring particularly to FIG. 1, in contrast to my prior U.S. Pat. Nos. 6,129,990 and 6,127,051 in which the metal layers are joined with a plurality of spaced-apart welds around their entire perimeters, in the present invention steel layer 12 is attached to copper foil layer 14 through the use of a combination of a plurality of spaced-apart welds 16 and strips or lines of adhesive 28. In the manufacturing process, it has been found that welds along the entire perimeter can tend to stress the thin copper layer. This stress, which tends to occur when a third or fourth perimeter edge is welded, can be eliminated by using a combination of welds and adhesive.

Accordingly, in the present invention the metal layers are preferably joined using two lines of spaced-apart welds 16 and two lines of adhesive 28. As can be seen, each line of welds 16 is preferably positioned adjacent and perpendicular to a line of adhesive 28. In the industry, a typical PCB lay-up sheet is rectangular and has an overall size of approximately eighteen inches by approximately twenty-four inches sheet. In the preferred embodiment of the invention, the resistance welds are positioned along the perimeter of the sheets defining the short sides (e.g., the eighteen-inch sides in the sheet). Therefore, the lines of adhesive are positioned along the perimeter of the sheets defining the long sides (e.g., the twenty-four inch sides of the sheets). It will be appreciated that the adhesive would typically be applied prior to the welding taking place.

While the lines of welds and adhesive are on opposing sides of the sheets in preferred embodiment, the lines of welds 16 and lines of adhesive 28 may be on adjacent sides, respectively. Further, a single line of welds 16 and a single line of adhesive 28 may be used, although sufficient attachment strength would not likely result.

Welds 16, which are contact bonds between the surfaces of the materials and generally comprise circular-shaped welds of approximately 4-mils to 20-mils in diameter, are preferably placed along the perimeter of the two opposing sides of the sheets within a marginal area 18. While the width of marginal area 18 can be larger if desired, the present invention permits the use of a smaller marginal area than that commonly found in the industry. More particularly, because of the precision with which the resistance welds can be made, it is possible with the present invention to reduce the width of marginal area 18 to approximately 0.25 inches or less from the outside edge of the sheets if desired. For example, conventional laminate structures typically have marginal areas of between approximately 0.50 inches and 1.0 inches wide, which provides a total overlap of approximately 1.0 inches to 2.0 inches. This is due to the flow characteristics of the adhesive leaving an unusable area around the perimeter of the laminate structure. In practice, the unusable marginal area is trimmed away in the manufacturing process, leaving a finished board size. For example, in order to achieve a standard sized 18-inch×24-inch circuit board panel where only adhesives are used, a 19-inch×25-inch laminate is generally required because there is a 0.50 inch border along each side which is cut away after lamination. Hence, the resistance welding technique of the present invention is advantageous in that it eliminates waste, thus providing a larger effective usable area of the PCB panel.

Welds 16 are arranged generally linearly in a plurality of occurrences such that gaps or openings 20 are preferably defined between welds 16. The length of gaps 20 can vary, but would typically range from approximately ½ inch to 2.5 inches depending upon the product type and specification. Apertures 22 along each edge of laminate 10 represent typical tooling positions. Apertures 22 are typically disposed between the outer edges of laminate 10 and the finished circuit area 24. The finished panel edge 26 is formed after flash trimming by the purchaser.

Note also that, because use of a steel layer in accordance with the present invention eliminates the bellows effect found in copper/aluminum laminate structures, there is no need for a continuous seal between the layers to guard against entry of dust and debris. Therefore, in the present invention the bonding points do not have to form a continuous band around the entire perimeter of the sheets. And, while welds 16 are shown positioned along the top and bottom sides of the structure, they could be alternatively positioned along the left and right sides.

It will be understood from my prior patents that resistance welding is a thermoelectric process in which heat is generated by passing an electrical current through the parts to be joined. The process uses electrodes to push the parts together with sufficient force to remove the surface oxides that would otherwise inhibit current flow. Once physical contact is established, a controlled combination of resistance generated heat and physical pressure is applied through the electrodes to create the actual joint. The amount of heat generated is a function of the current applied, the length of time it is applied, and the resistance profile between the parts being joined.

Resistance welding is generally understood as a method for bonding materials in one of three ways. One way is through brazed or soldered bonds, where resistance heating of the parts to be joined generates sufficient heat to melt a third metal, such as silver solder alloy or tin/lead solder that is used as an intermediate bonding agent. A second way is use forge welds where a very short weld-time current is used to forge the parts together without melting them; that is, to establish a metal to metal bond. Forge welds are particularly well suited for joining dissimilar materials. The third way is through fusion bonding where a longer pulse is used to melt both parts to a liquid at their interface point, and the parts are held together as they cool to establish metal-to-metal bonds. Fusion bonding is particularly well suited for joining two similar materials.

In the preferred embodiment of the invention, the materials are joined using forge welds rather than using fusion bonding or an intermediate bonding agent such as solder between the materials. It is important that welds 16 be sufficiently weak that, when the laminate structure is placed into the press and the copper is heated and compressed onto the PCB panel, the strong bond between the copper and pre-preg in the PCB panel automatically breaks the welds so that the metal substrate 12 can easily be removed and discarded.

For a copper/steel/copper laminate structure using the materials described herein, for example, satisfactory bonds can be achieved using approximately 10.6 watt-seconds of energy and a welding head force of approximately five pounds. These levels are affected by the following variables: the welding energy used to generate heat, the amount of time the energy is applied, the physical weld force that is applied, and the properties of the materials being joined such as metallurgic properties, resistance, thickness, configuration and coatings. Preferably from approximately 5.0 watt-seconds to approximately 25 watt-seconds of energy and approximately two pounds to ten pounds of force should be available to accommodate production variances. Exact values can be determined empirically.

A system suitable for carrying out resistance welding in accordance with the present invention is available from UNITEK, and includes a model 125DP dual pulse power supply with a maximum output of 125 watt-seconds, a model PM7S programmable AC power supply rated at 2

KVA, a model 80A/24 air actuated weld held, rated 125 ws/2 kva and 8 ounce to 20 pounds of force, model ESO413 tungsten electrodes, and models EW4002 and HW1090 wheel electrodes. It will also be appreciated that other types of welding techniques could be used, and that the bonds need only be sufficiently strong to remain intact during material handling but be capable of being broken in the press.

Referring again to FIG. 1, in the preferred embodiment of the invention there are continuous lines of adhesive material 28 on opposing sides of the sheets that are adjacent to the sides with the welds 16. The adhesive material 28 preferably comprises a rubber compound since rubber compound adhesives offer more durability in handling prior to its use. The lines of adhesive material 28 are placed along the perimeter of opposing sides of the sheets, and within margin 18 that is typically between approximately 0.50 inches and 1 inch wide, depending on end product and customer requirements. The width of each line of adhesive material 28 typically varies between approximately 0.002 inches and approximately 0.100 inches, but is preferably between approximately 0.060 inches and approximately 0.090 inches, and the height or thickness is typically between approximately 0.001 inches and approximately 0.003 inches. Note also that, as an alternative to applying adhesive material 28 in continuous lines, the adhesive material can be applied in the form of spaced-apart strip, dots or the like that form a discontinuous or gapped line of adhesive material.

Accordingly, it will be seen that this invention provides for joining a steel alloy substrate layer and a copper foil layer using resistance welds and adhesive for use as a laminate structure that is placed in a press lay-up for lamination to produce PCB panels. In addition, the invention also provides a metal substrate layer that is superior in its characteristics than conventional metal substrate layers. It will be appreciated that, while the preferred embodiment of the invention comprises a steel alloy substrate layer bonded to a copper layer, the combination of adhesive and resistance welds can be used to bond other metal layers to copper, including conventionally used aluminum.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

| Composition | 1008 CS STEEL Iron and carbon | 3004 H-19 ALUMINUM Aluminum with traces of magnesium and manganese. |
|---|---|---|
| Hardness (Knoop) | 199–220 | 60–70 |
| Density (lb/in$^3$) | 0.290 | 0.098 |
| CTE (inches/° F.) | 7.2 | 13.9 |
| Yield Strength (lb/in$^2$) | 133,000 | 41,000 |
| Tensile Strength (lb/in$^2$) | 140,000 | 43,000 |
| Modulus of Elasticity (lb/in$^2$) | 29,000,000 | 10,200,000 |
| Roughness (RMS) | <12 | 18–25 |

What is claimed is:

1. A separator sheet laminate for use in manufacturing printed circuit boards, comprising:
    (a) a metal substrate layer;
    (b) at least one foil layer of copper disposed over a surface of said substrate layer;
    (c) a plurality of spaced-apart welds joining said substrate layer and said foil layer along the periphery of a first edge of said foil layer; and
    (d) adhesive joining said substrate layer and said foil layer along the periphery of a second edge of said foil layer.

2. A sheet laminate as recited in claim 1, wherein said substrate layer comprises carbon steel.

3. A sheet laminate as recited in claim 1, wherein said substrate layer comprises aluminum.

4. A sheet laminate as recited in claim 1, wherein said first and second edges of said foil layer are adjacent.

5. A sheet laminate as recited in claim 1, wherein said first and second edges of said foil layer are opposing.

6. A sheet laminate as recited in claim 1, further comprising a plurality of spaced-apart welds joining said substrate layer and said foil layer along the periphery of a third edge of said foil layer.

7. A sheet laminate as recited in claim 1, further comprising adhesive joining said substrate layer and said foil layer along the periphery of a third edge of said foil layer.

8. A sheet laminate as recited in claim 1, further comprising a plurality of spaced-apart welds joining said substrate layer and said foil layer along the periphery of a third edge of said foil layer and adhesive joining said substrate layer and said foil layer along the periphery of a fourth edge of said foil layer.

9. A sheet laminate according to claim 8, wherein said first edge of said foil layer is opposite to said third edge, wherein said second edge of said foil layer is opposite to said fourth edge of said foil layer.

10. A sheet laminate as recited in claim 1, wherein said substrate layer comprises carbon steel having a coefficient of thermal expansion less than approximately 9.8µ inches per °F. and wherein said metal substrate layer has a Knoop hardness between approximately 150 and approximately 850.

11. A sheet laminate as recited in claim 1, wherein said substrate layer has a thickness between approximately 0.002 and approximately 0.025 inches.

12. A sheet laminate as recited in claim 1, wherein said substrate layer comprises carbon steel having a surface finish of less than approximately 12 RMS.

13. A sheet laminate as recited in claim 1, wherein said foil layer has a thickness between approximately 0.00025 and approximately 0.005 inches.

14. A separator sheet laminate for use in manufacturing printed circuit boards, comprising:
- (a) a metal substrate layer;
- (b) at least one foil layer of copper disposed over a surface of said substrate layer;
- (c) a plurality of metal-to-metal bonds joining said metal substrate layer and said foil layer, said bonds arranged generally linearly along the periphery of a first edge of said foil layer such that gaps are defined between said bonds; and
- (d) adhesive joining said substrate layer and said foil layer, said adhesive arranged generally linearly along the periphery of a second edge of said foil layer.

15. A sheet laminate as recited in claim 14, wherein said substrate layer comprises carbon steel.

16. A sheet laminate as recited in claim 14, wherein said substrate layer comprises aluminum.

17. A sheet laminate as recited in claim 14, wherein said first and second edges of said foil layer are adjacent.

18. A sheet laminate as recited in claim 14, wherein said first and second edges of said foil layer are opposing.

19. A sheet laminate as recited in claim 14, further comprising a plurality of metal-to-metal bonds joining said metal substrate layer and said foil layer, said bonds arranged generally linearly along the periphery of a third edge of said foil layer such that gaps are defined between said bonds.

20. A sheet laminate as recited in claim 14, further comprising adhesive joining said substrate layer and said foil layer, said adhesive arranged generally linearly along the periphery of a third edge of said foil layer.

21. A sheet laminate as recited in claim 14, further comprising:
- a plurality of metal-to-metal bonds joining said metal substrate layer and said foil layer, said bonds arranged generally linearly along the periphery of a third edge of said foil layer such that gaps are defined between said bonds; and
- adhesive joining said substrate layer and said foil layer, said adhesive arranged generally linearly along the periphery of a fourth edge of said foil layer.

22. A sheet laminate according to claim 21, wherein said first edge of said foil layer is opposite to said third edge of said foil layer, wherein said second edge of said foil layer is opposite to said fourth edge of said foil layer.

23. A sheet laminate as recited in claim 14, wherein said substrate layer comprises carbon steel having a coefficient of thermal expansion less than approximately $9.8\mu$ inches per °F. and wherein said metal substrate layer has a Knoop hardness between approximately 150 and approximately 850.

24. A sheet laminate as recited in claim 14, wherein said substrate layer has a thickness between approximately 0.002 and approximately 0.025 inches.

25. A sheet laminate as recited in claim 14, wherein said substrate layer comprises carbon steel having a surface finish of less than approximately 12 RMS.

26. A sheet laminate as recited in claim 14, wherein said foil layer has a thickness between approximately 0.00025 and approximately 0.005 inches.

27. A separator sheet laminate for use in manufacturing printed circuit boards, comprising:
- (a) a metal substrate layer;
- (b) at least one foil layer of copper disposed over a surface of said substrate layer;
- (c) a first plurality of metal-to-metal bonds joining said substrate layer and said foil layer, said bonds arranged generally linearly along the periphery of a first edge of said foil layer such that gaps are defined between said bonds;
- (d) a second plurality of metal-to-metal bonds joining said substrate layer and said foil layer, said bonds arranged generally linearly along the periphery of second edge of said foil layer such that gaps are defined between said bonds;
- (e) a first line of adhesive joining said substrate layer and said foil layer arranged generally linearly along the periphery of a third edge of said foil layer; and
- (f) a second line of adhesive joining said substrate layer and said foil layer arranged generally linearly along the periphery of a fourth edge of said foil layer.

28. A sheet laminate as recited in claim 27, wherein said substrate layer comprises carbon steel having a coefficient of thermal expansion less than approximately $9.8\mu$ inches per °F. and wherein said substrate layer has a surface finish of less than approximately 12 RMS.

29. A sheet laminate as recited in claim 27, wherein said substrate layer has a thickness between approximately 0.002 and approximately 0.025 inches.

30. A sheet laminate as recited in claim 27, wherein said foil layer has a thickness between approximately 0.00025 and approximately 0.005 inches.

31. A sheet laminate as recited in claim 27, wherein said substrate layer comprises carbon steel having a Knoop hardness between approximately 150 and approximately 850.

32. A separator sheet laminate for use in manufacturing printed circuit boards, a comprising:
- (a) a carbon steel substrate layer which has a coefficient of thermal expansion less than approximately $9.8\mu$ inches per °F., said substrate layer having a Knoop hardness between approximately 150 and approximately 850, said substrate layer having a surface finish of less than approximately 12 RMS;
- (b) at least one copper foil layer having a thickness between approximately 0.00025 and approximately 0.005 inches, said foil layer disposed over a surface of said substrate layer;
- (c) a plurality of metal-to-metal bonds joining said substrate layer and said foil layer, said bonds arranged generally linearly along the periphery of a first edge and the periphery of a second edge of said foil layer such that gaps are defined between said bonds; and
- (d) at least one line of adhesive joining said substrate layer to said foil layer arranged generally linearly along the periphery of a third and a fourth edge of said foil layer.

33. A sheet laminate as recited in claim 32, wherein said lines of adhesive are disposed on opposing edges of said foil layer.

* * * * *